United States Patent
Chuang et al.

(10) Patent No.: US 10,361,498 B2
(45) Date of Patent: Jul. 23, 2019

(54) BOARD-TO-BOARD CONNECTOR

(71) Applicants: NICECONN TECHNOLOGY CO., LTD., New Taipei (TW); Yi-Fang Chuang, New Taipei (TW); Nai-Chien Chang, New Taipei (TW)

(72) Inventors: Yi-Fang Chuang, New Taipei (TW); Nai-Chien Chang, New Taipei (TW)

(73) Assignees: NICECONN TECHNOLOGY CO., LTD., New Taipei (TW); Yi-Fang Chuang, New Taipei (TW); Nai-Chien Chang, New Taipei (TW)

( * ) Notice: Subject to any disclaimer, the term of this patent is extended or adjusted under 35 U.S.C. 154(b) by 0 days.

(21) Appl. No.: 15/884,394

(22) Filed: Jan. 31, 2018

(65) Prior Publication Data
US 2019/0081422 A1    Mar. 14, 2019

(30) Foreign Application Priority Data
Sep. 12, 2017   (TW) .............................. 106131294 A

(51) Int. Cl.
| | |
|---|---|
| H01R 4/02 | (2006.01) |
| H05K 1/18 | (2006.01) |
| H01R 12/71 | (2011.01) |
| H01R 12/73 | (2011.01) |
| H01R 13/20 | (2006.01) |
| H01R 13/66 | (2006.01) |
| H01R 24/60 | (2011.01) |
| H01R 107/00 | (2006.01) |

(52) U.S. Cl.
CPC ......... *H01R 12/716* (2013.01); *H01R 12/732* (2013.01); *H01R 13/6658* (2013.01); *H01R 24/60* (2013.01); *H05K 1/18* (2013.01); *H01R 4/02* (2013.01); *H01R 13/20* (2013.01); *H01R 2107/00* (2013.01)

(58) Field of Classification Search
CPC .......... H05K 3/368; H05K 3/308; H05K 1/18; H01R 23/7073; H01R 23/7068; H01R 23/025; H01R 23/725; H01R 13/6658; H01R 9/096; H01R 12/716; H01R 12/732; H01R 24/60; H01R 2107/00; H01R 4/02; H01R 13/20
USPC ...................................... 439/75, 79, 76.1, 74
See application file for complete search history.

(56) References Cited

U.S. PATENT DOCUMENTS

| | | | | |
|---|---|---|---|---|
| 3,897,126 A * | 7/1975 | Frances | .................. | H05K 1/117 439/55 |
| 5,040,993 A * | 8/1991 | Krug | ..................... | G06F 13/409 439/75 |
| 9,220,163 B2 * | 12/2015 | Hashiguchi | ............ | H01R 12/73 |

(Continued)

*Primary Examiner* — Gary F Paumen
(74) *Attorney, Agent, or Firm* — Chun-Ming Shih; HDLS IPR Services

(57) ABSTRACT

A board-to-board connector includes a first circuit board and a second circuit board. The first circuit board has at least one cut. The second circuit board includes a tongue assembly disposed corresponding to the cut, a plurality of connection portions disposed on two opposite surfaces of the tongue assembly, and a plurality of conductive portions electrically connected to the first circuit board. Therefore, the board-to-board connector can effectively reduce the distance between the first circuit board and the second circuit board, which is applicable to the increasingly lightweight and compact electronic devices.

12 Claims, 10 Drawing Sheets

(56) References Cited

U.S. PATENT DOCUMENTS

| | | | | |
|---|---|---|---|---|
| 2008/0242127 A1* | 10/2008 | Murr | ............... | H01R 13/665 |
| | | | | 439/79 |
| 2009/0191763 A1* | 7/2009 | Zhu | ............... | H01R 12/716 |
| | | | | 439/632 |
| 2013/0273773 A1* | 10/2013 | Lan | ............... | H01R 12/57 |
| | | | | 439/566 |
| 2018/0138646 A1* | 5/2018 | Chuang | ............ | H05K 1/117 |

\* cited by examiner

BOARD-TO-BOARD CONNECTOR

BACKGROUND OF THE INVENTION

Field of the Invention

The present invention relates to a connector and in particular to a board-to-board connector which complies with the USB Type-C interface specification.

Description of Prior Art

The latest developed USB Type-C connector has the advantages of the smallest interface size, the fastest transmission rate, reversible plug-in, backward compatibility and broad applicability. Therefore, the USB Type-C connector is gradually adopted by current various 3C electronic products. However, when the smartphone with a big display screen uses the above-mentioned the USB Type-C connector, the resultant whole thickness and volume increase and thus a bigger display screen cannot be designed and placed onto the original smartphone. Therefore, how to apply the USB Type-C connector and implement a bigger display screen or a compact structure in the current big-display smartphone becomes a vital issue to be resolved by the inventor.

SUMMARY OF THE INVENTION

An objective of the present invention is to provide a board-to-board connector which reduces the distance between the first circuit board and the second circuit board and is applicable to the increasingly lightweight and compact electronic devices.

In order to achieve the above objective, the present invention provides a board-to-board connector which comprises a first circuit board and a second circuit board. The first circuit board has at least one cut. The second circuit board comprises a tongue assembly disposed corresponding to the cut, a plurality of connection portions disposed on two opposite surfaces of the tongue assembly, and a plurality of conductive portions electrically connected to the first circuit board.

The present invention has the following effects. In an embodiment, the second circuit board is a circuit board complying with USB Type-C interface specification. That is, the specifications of the tongue assembly and each of the connection portions comply with the USB Type-C interface specification. Also, the width of the tongue assembly is less than that of the cut to be plugged in the docking connector.

When the first circuit board is electrically connected to the second circuit board, each of the conductive portions of the second circuit board is a conductive terminal and is attached to the first circuit board using, for example, DIP or SMT technique. In another embodiment, each of the conductive portions can be a conductive pad and is attached to the first circuit board using SMT technique. In this way, the distance between the first circuit board and the second circuit board is reduced, which further achieves compact mechanism design or more room for mechanism design.

In yet another embodiment, the board-to-board connector further comprises a metal shell sleeved on the tongue assembly. The metal shell complies with the USB Type-C interface specification and has a shell body, at least one elastic piece disposed on the shell body, a positioning protrusion disposed adjacent to the elastic piece, and two positioning pieces individually disposed on two sides of the metal shell. In still yet another embodiment, part of the at least one elastic piece and the positioning protrusion are protruded toward the tongue assembly and the two positioning pieces are penetrated into or evenly soldered to the individual two positioning portions.

The board-to-board connector of the present invention uses the positioning pieces of the metal shell to effectively moderate/reduce the extent of sway or vibration caused by the tongue assembly in the cut of the first circuit board such that the stability of the connection between the board-to-board connector and the docking connector is improved.

DETAILED DESCRIPTION OF THE INVENTION

Figure 1:
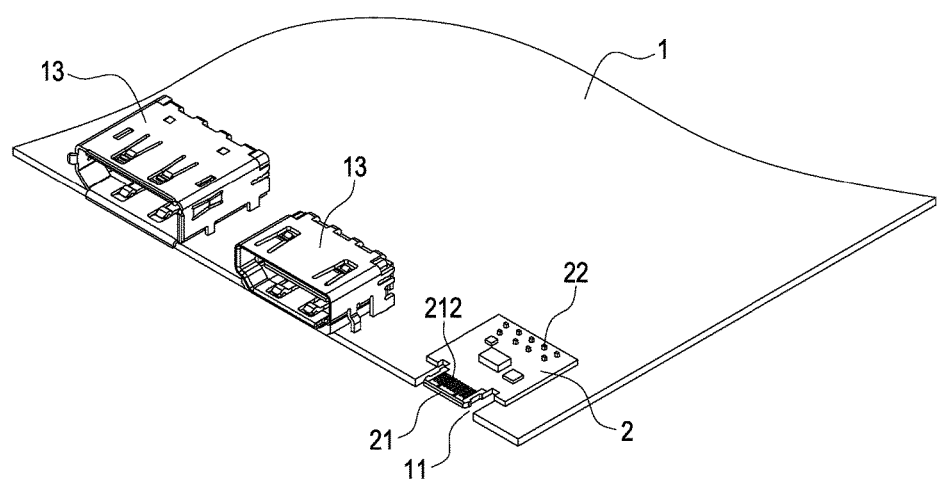
FIG. 1 is a partial perspective view of the board-to-board connector according to the first preferred embodiment of the present invention.
Figure 2:
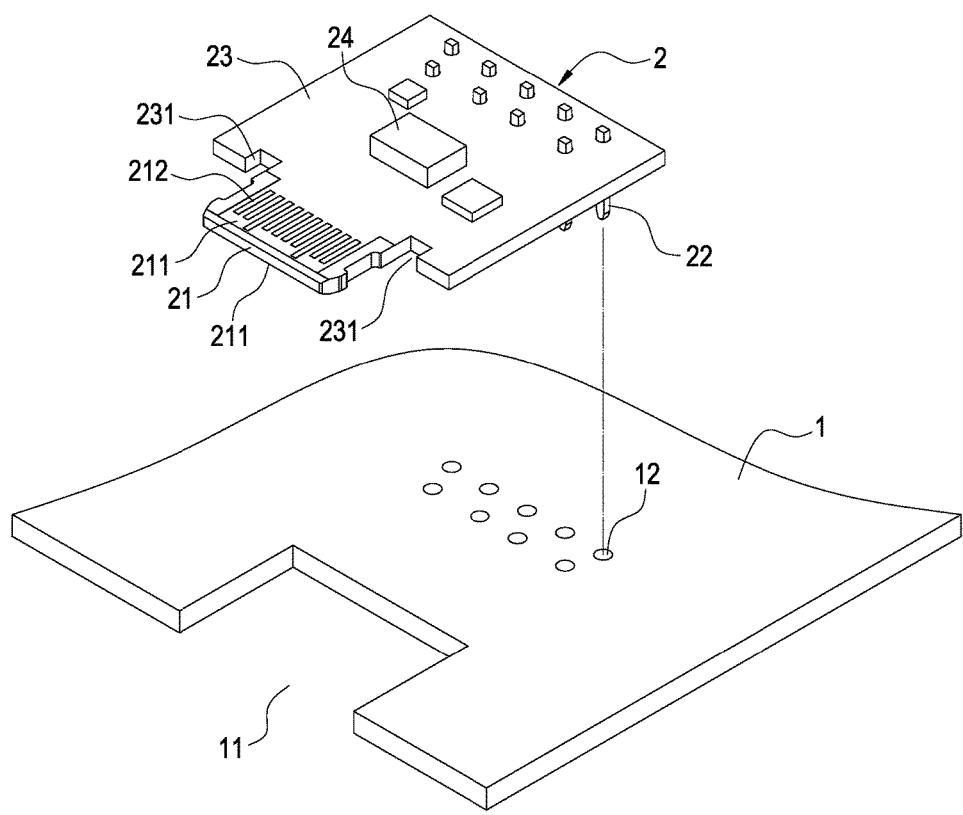
FIG. 2 is an exploded view of the board-to-board connector according to the first preferred embodiment of the present invention.
Figure 3:
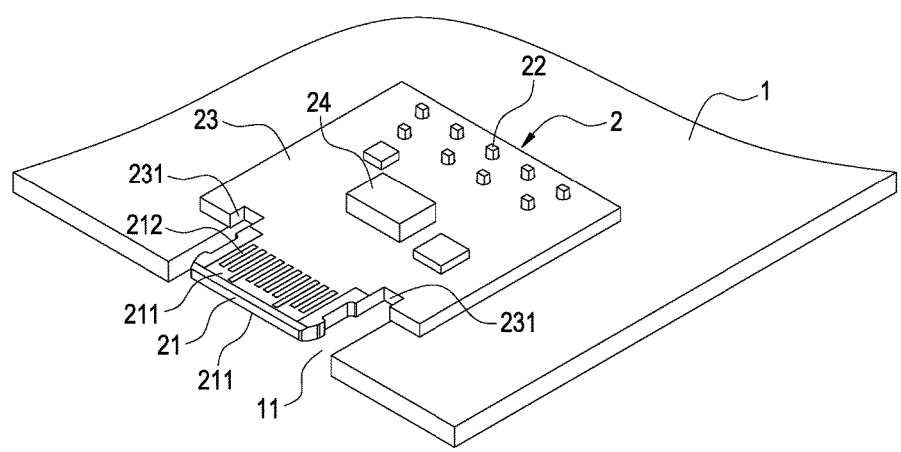
FIG. 3 is a perspective view of the board-to-board connector according to the first preferred embodiment of the present invention.

The detailed description and technical details of the present invention will be explained below with reference to accompanying drawings. However, the accompanying drawings are only for reference and explanation, but not to limit the scope of the present invention.

Please refer to FIGS. 1-5. The present invention provides a board-to-board connector which comprises a first circuit board 1 and a second circuit board 2. As shown in the first preferred embodiment of FIG. 1, the first circuit board 1 is preferably a mother board installed in a PC host (not shown) and the second circuit board 2 is a printed circuit board (e.g., a rigid printed circuit board or a flexible printed circuit board) which complies with the USB Type-C interface specification. Thus, the first circuit board 1 is further provided with plural connecting ports 13 arranged in parallel with the second circuit board 2. The plural connecting ports 13 can be, for example, HDMI, USB 2.0, or other proper connectors, but not limited to these.

In the current embodiment, the first circuit board 1 is provided with at least one cut 11 and a plurality of positioning portions 12. The second circuit board 2 comprising a tongue assembly 21 disposed corresponding to the cut 11, a plurality of connection portions 212 disposed on two opposite surfaces of the tongue assembly 21, and a plurality of conductive portions 22 electrically connected to the first circuit board 1. As shown in FIGS. 2-5, the specifications of the tongue assembly 21 and each of the connection portions 212 comply with the USB Type-C interface specification and the width of the tongue assembly 21 is less than that of the cut 11, which enables the connection with the plug 101 of the docking connector 100 complying with the USB Type-C interface specification likewise.

In particular, the connection portions 212 are individually exposed on the two opposite surfaces 211 of the tongue assembly 21 and individually form gold fingers and the number of the connection portions is 24 in total. Moreover, the length of tongue assembly 21 can be longer, equal to, or even shorter than the size of the cut 11. It is adjustable based on the requirements and not limited.

Figure 4A:
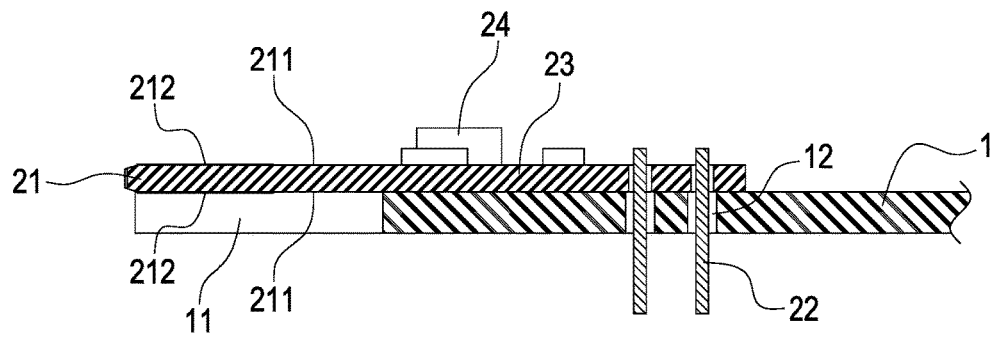
FIG. 4A is a cross-sectional view of the board-to-board connector according to the first preferred embodiment of the present invention.
Figure 4B:
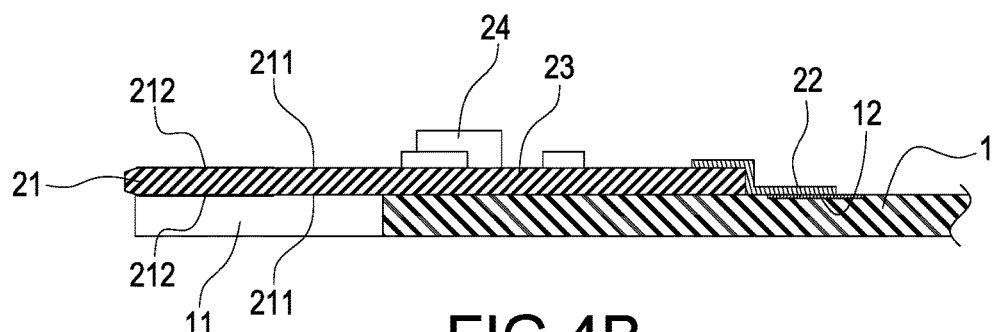
FIG. 4B is another cross-sectional view of the board-to-board connector according to the first preferred embodiment of the present invention.
Figure 4C:
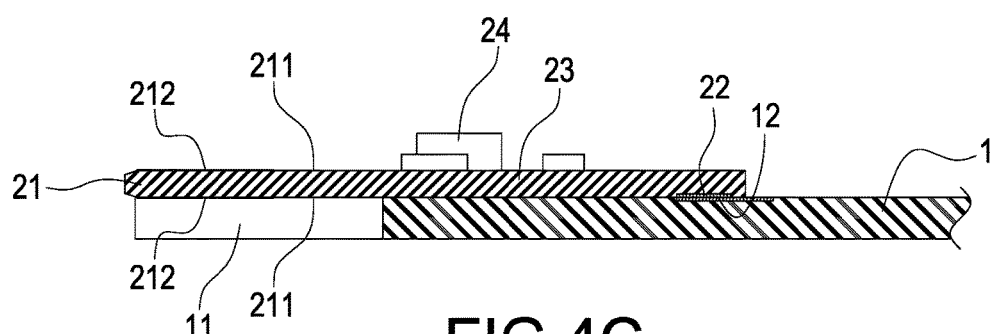
FIG. 4C is yet another cross-sectional view of the board-to-board connector according to the first preferred embodiment of the present invention.

As shown in FIGS. 4A, 4B, and 4C, each of the conductive portions 22 of the second circuit board 2 is soldered to the first circuit board 1 using DIP (Dual In Line Package) or SMT (Surface Mount Technology) process. In other words, as shown in FIG. 4A using DIP process, each of the conductive portions 22 is preferably a conductive terminal and each of the positioning portions 12 is preferably a throughhole, which facilities the soldering process after the conductive terminals pass through the throughholes. As shown in FIG. 4B or FIG. 4C using SMT process, each of the conductive portions 22 can be a conductive terminal and bent and be soldered to each of the positioning portions 12 of the first circuit board 1. Alternatively, each of the conductive portions 22 can be a conductive pad and be soldered to each of the positioning portions 12 which is also a conductive pad such that each of the conductive portions 22 can be evenly attached to each of the positioning portions 12. In this way, the second circuit board 2 can be soldered to the first circuit board 1 to effectively reduce the distance between the first circuit board 1 and the second circuit board 2 and the whole volume thereof, which provides more room for mechanism design to fit the increasingly lightweight and compact electronic devices or the electronic devices for other purposes.

In addition, the second circuit board 2 further comprises a body 23 attached to the first circuit board 1; the body 23 is soldered to at least one electronic device 24. In the embodiment shown in FIGS. 2-5, the electronic device 24 can be arranged as the converter IC, protection IC, surge protection IC, inductor, resistor, or other applicable ICs to perform the signal communication, power supply, or other purposes which comply with the USB Type-C interface specification.

Figure 5:
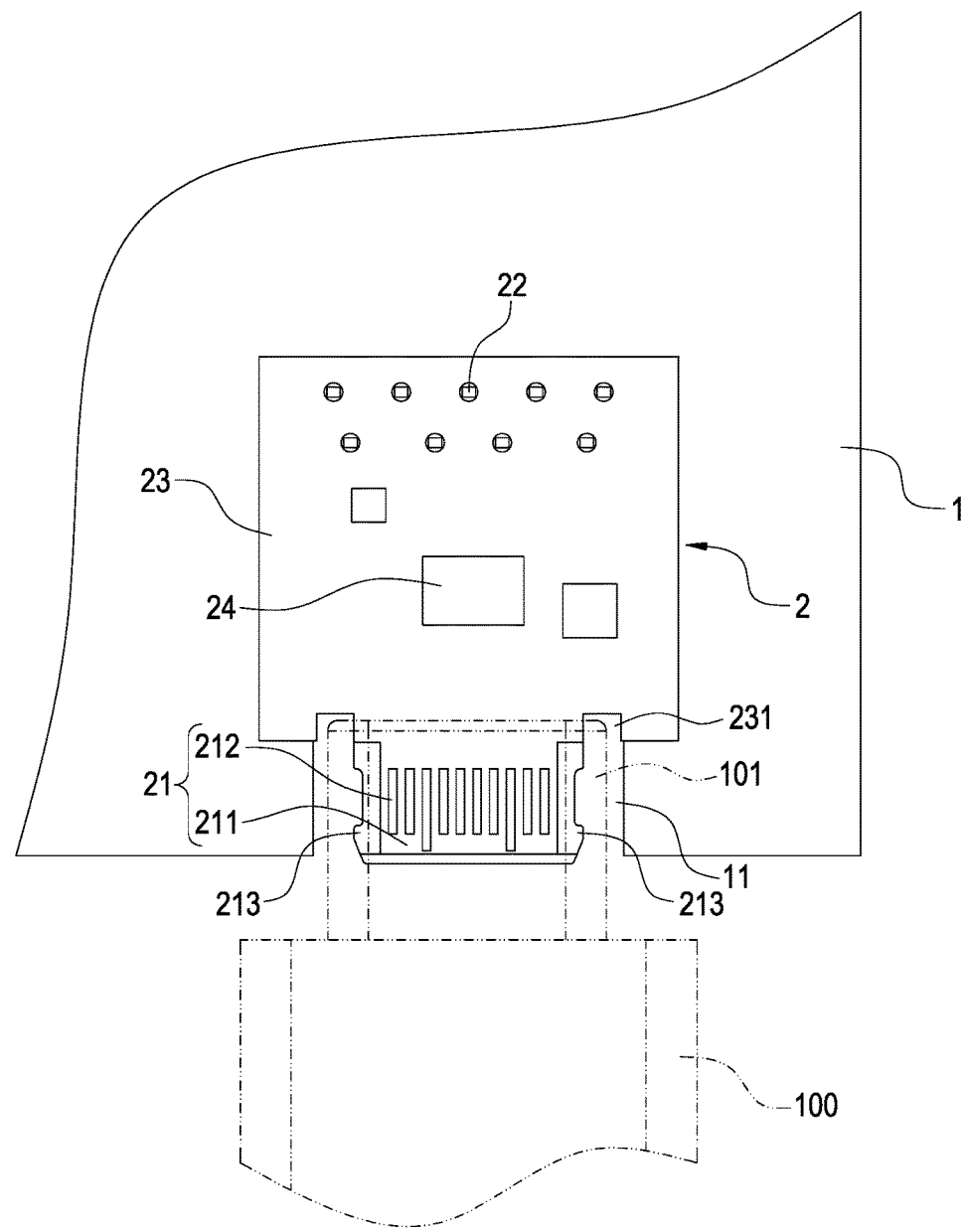
FIG. 5 is a schematic view of the connection between the board-to-board connector of the present invention and a docking connector.

In the embodiment shown in FIG. 5, an edge portion 213 made of metal is disposed on each of two sides of the tongue assembly 21 and is spaced with the individual connection portions 212 in order not to influence the signaling function of the adjacent connection portions 212. When the plug 101 of the docking connector 100 is plugged to the tongue assembly 21 of the second circuit board 2, the two edge portions 213 made of metal can improve wear resistance and prolong the lifespan of the tongue assembly 21.

Figure 6:
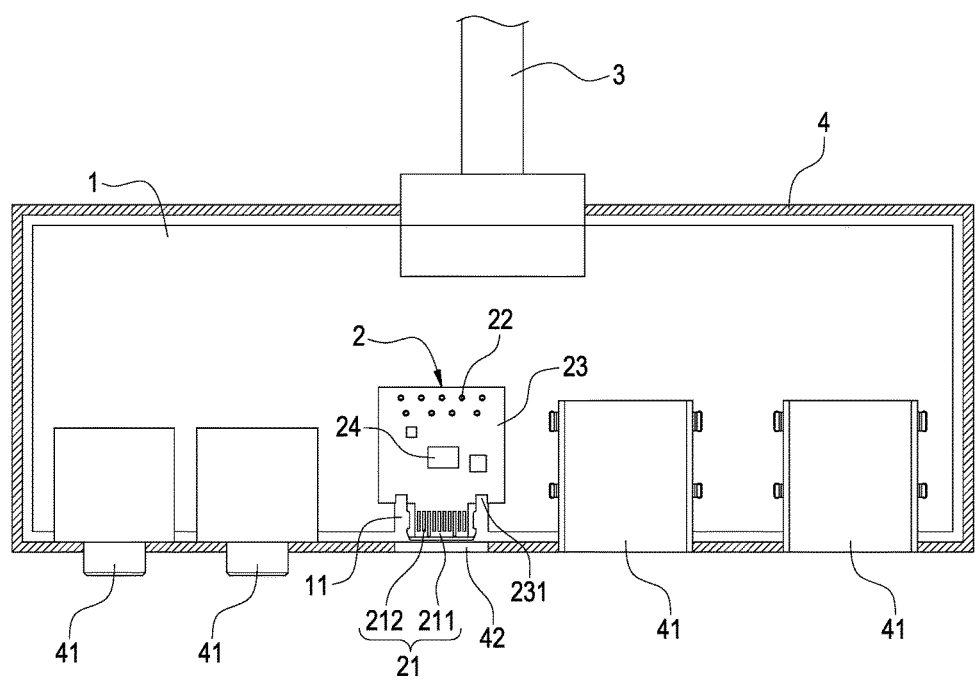
FIG. 6 is a schematic view of the second preferred embodiment of the present invention.
Figure 7:
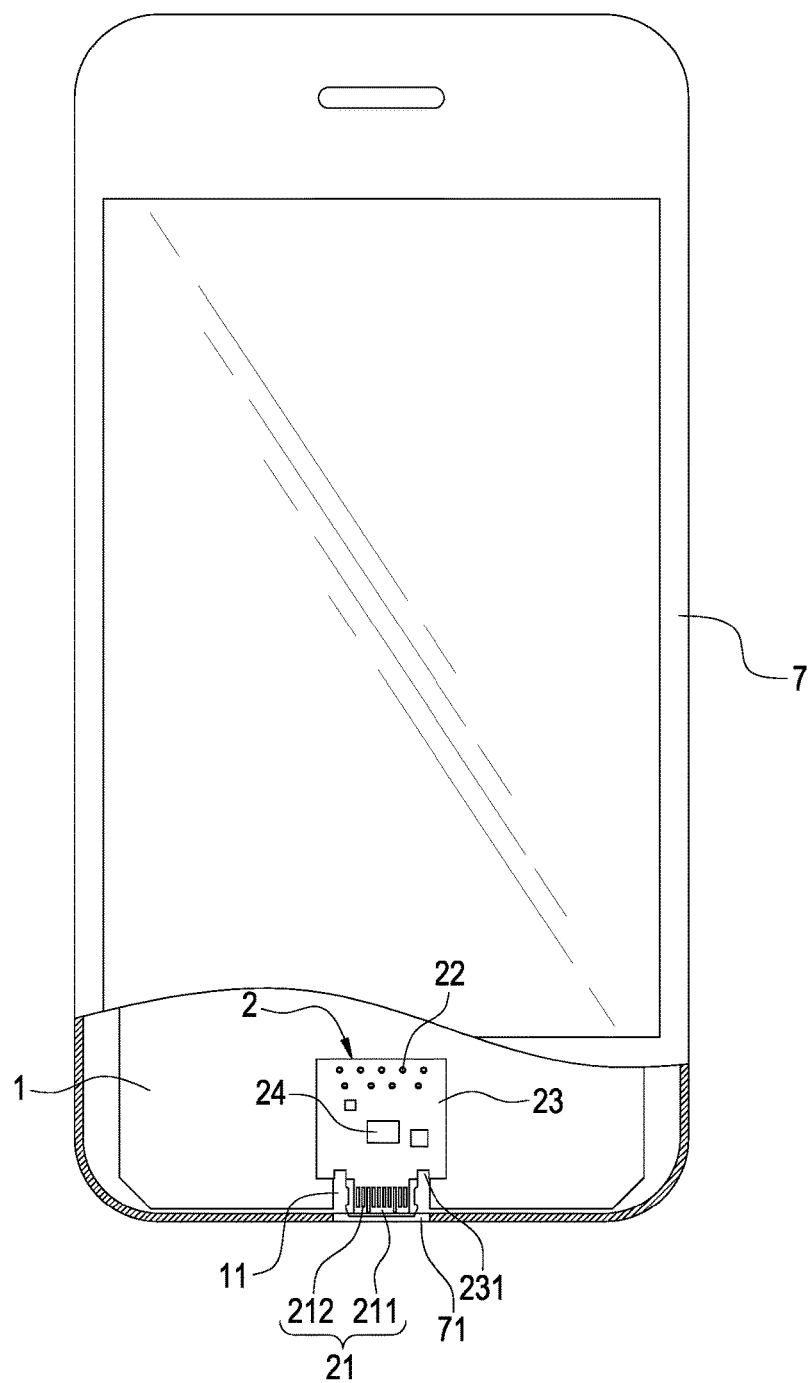
FIG. 7 is a schematic view of the third preferred embodiment of the present invention.

Please also refer to FIG. 6. In the second embodiment, the board-to-board connector further comprises a front cable 3 electrically connected to the first circuit board 1 and a plurality of connecting ports 41 soldered on the first circuit board 1. The above-mentioned connecting port 41, for example, can be the audio jack, USB 2.0 port, or other suitable connector port and not limited to these. As shown in FIG. 6, the first circuit board 1 is preferably a front board 4, installed to the front panel (not shown) of a PC host (not shown), to connect various connectors with the PC host for expansion. The front board 4 has an opening 42 corresponding to the tongue assembly 21 of the second circuit board 2 such that the plug 101 of the docking connector 100 can pass through the opening 42 to be electrically connected to the tongue assembly 21. However, in the third embodiment shown in FIG. 7, the electronic device can be a smartphone 7 or other suitable mobile electronic devices. The above-mentioned smartphone 7 has an opening 71 for connection with the docking connector (not shown); the second circuit board 2 is a printed circuit board complying with the USB Type-C interface specification.

Because the tongue assembly 21 of the second circuit board 2 in the first, second, or third embodiment is not equipped with a metal shell and is directly soldered to the mother board (i.e., the first circuit board 1) of the PC host or the smartphone, the effect of compact mechanism design or increased display size can be obtained without changing the size of the front board 4 or the smartphone 7.

Figure 8:
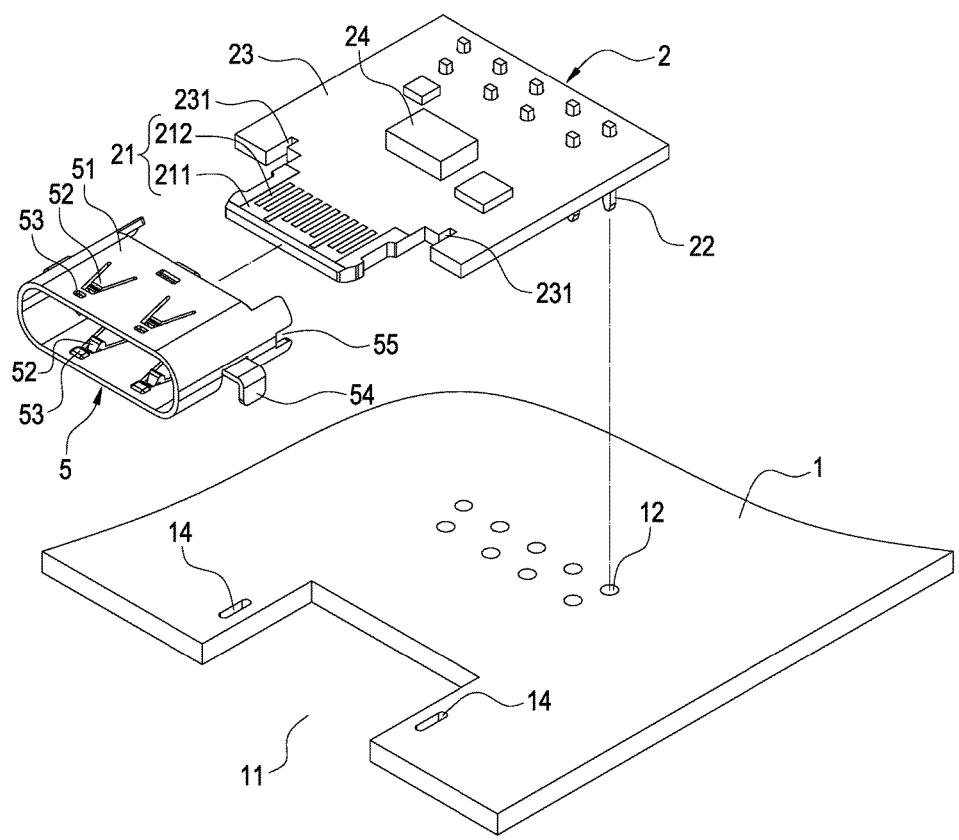
FIG. 8 is schematic view of the fourth preferred embodiment of the present invention.
Figure 9:
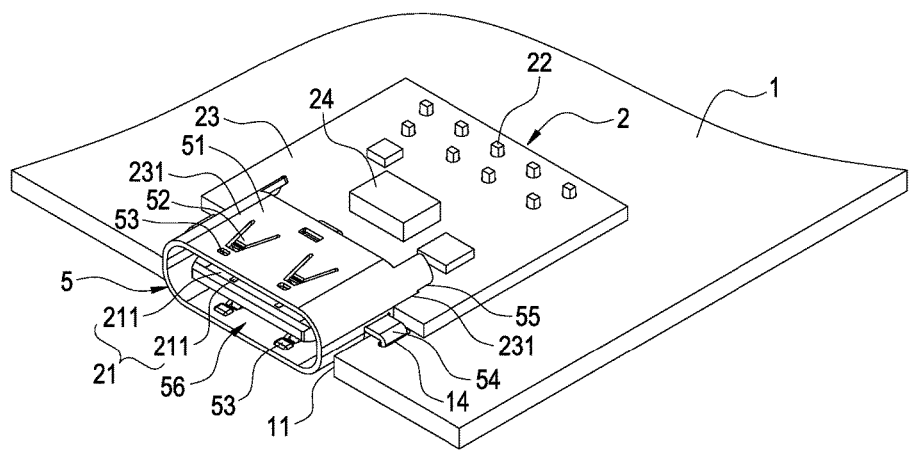
FIG. 9 is an assembly view of FIG. 8.

Please refer to FIGS. 8 and 9, which are the schematic view and the perspective view of the fourth preferred embodiment of the present invention, respectively. When no more room or compact structural design is required, the metal shell 5 can be used in a practical embodiment. In the current embodiment, the board-to-board connector further comprises a metal shell 5 sleeved on the tongue assembly 21 to reduce the probability of sway or vibration caused by the tongue assembly 21 in the cut 11.

The metal shell 5 complies with the USB Type-C interface specification and has a shell body 51, at least one elastic piece 52 disposed on the shell body 51, a positioning protrusion 53 disposed adjacent to the elastic piece 52, two positioning pieces 54 individually disposed on two sides of the shell body 51, and two positioning slits 55 disposed at the rear end of the shell body 51. When the metal shell 5 is sleeved on the tongue assembly 21, a slot 56 is formed for a stable connection with the plug of the docking connector (not shown).

The second circuit board 2 is provided with two limiting slits 231 corresponding to the two positioning slits 55 such that the metal shell 5 can use the positioning slits 55 to clamp the limiting slits 231 to be fixed to the first circuit board 1. The first circuit board 1 is provided with two positioning portions 14 corresponding to the two positioning pieces 54. As shown in FIGS. 8 and 9, the positioning portions 14 are preferably throughholes, which makes the sheet-like positioning pieces 54 easy to be penetrated into and soldered to individual two positioning portions 14. However, the individual positioning pieces 54 shown in FIG. 10 can also be evenly soldered to the individual positioning portions 14, like the flat pads, which can change based on the requirements. Therefore, by means of the individual positioning pieces 54 of the metal shell 5, the extent of sway or vibration caused by the tongue assembly 21 in the cut 11 of the first circuit board 1 can be effectively moderated/reduced to improve the stability of the connection between the board-to-board connector and the docking connector 100.

Figure 10:
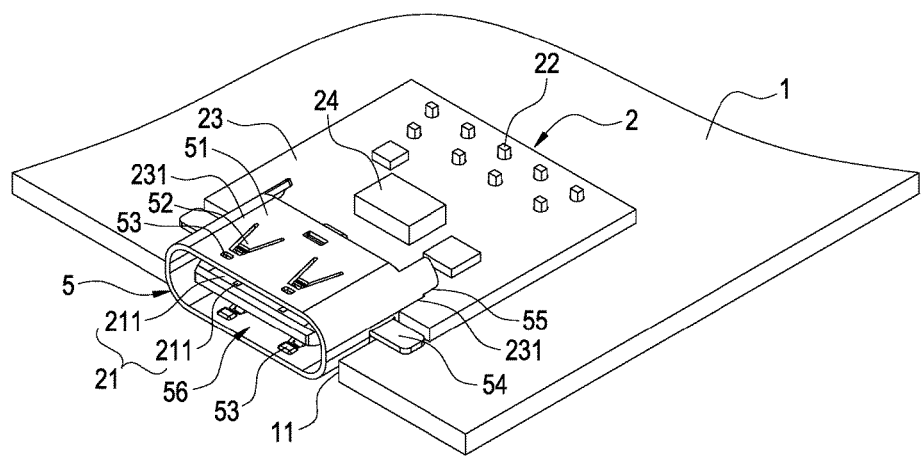
FIG. 10 is another assembly view of FIG. 8.

Besides, in the embodiment shown in FIGS. 8-10, the contact portion (not shown) of each of the elastic pieces 52 and the positioning protrusion 53 protrude toward the tongue assembly 21 to enhance the holding force and positioning effect on the plug 101 of the docking connector 100. The numbers of the elastic pieces 52 and the positioning protrusions 53 are preferably four and are disposed adjacent to each other, but not limited by the current embodiment.

In summary, the embodiments disclosed in the above description are only preferred embodiments of the present invention, but not to limit the scope of the present invention. The scope of the present invention should be embraced by the accompanying claims and includes all the equivalent modifications and not be limited to the previous description.

What is claimed is:

1. A board-to-board connector, comprising:
   a first circuit board having at least one cut; and
   a second circuit board comprising a tongue assembly disposed corresponding to the cut, a plurality of connection portions disposed on two opposite surfaces of the tongue assembly, and a plurality of conductive portions electrically connected to the first circuit board, wherein the connection portions are individually exposed on the two opposite surfaces of the tongue assembly and individually form gold fingers, wherein the number of the connection portions is 24.

2. The board-to-board connector according to claim 1, wherein the specifications of the tongue assembly and each of the connection portions comply with the USB Type-C interface specification and the width of the tongue assembly is less than that of the cut.

3. The board-to-board connector according to claim 1, wherein each of the conductive portions of the second circuit board is a conductive terminal and is attached to the first circuit board using DIP process.

4. The board-to-board connector according to claim 1, wherein each of the conductive portions of the second circuit board is a conductive pad and is attached to the first circuit board using SMT process.

5. The board-to-board connector according to claim 1, wherein the second circuit board further comprises a body attached to the first circuit board, wherein the body is electrically connected to at least one electronic device.

6. The board-to-Board connector according to claim 1, wherein an edge portion made of metal is disposed on each of two sides of the tongue assembly and is spaced with the individual connection portions.

7. The board-to-board connector according to claim 1, further comprising a front cable electrically connected to the first circuit board and a plurality of connecting ports soldered on the first circuit board, wherein the first circuit board is a front board having an opening corresponding to the tongue assembly of the second circuit board.

8. The board-to-board connector according to claim 1, wherein the first circuit board is a mother board installed in an electronic device and the second circuit board is a printed circuit board that complies with the USB Type-C interface specification.

9. The board-to-board connector according to claim 8, wherein the electronic device is a PC host or a smartphone.

10. The board-to-board connector according to claim 1, further comprising a metal shell sleeved on the tongue assembly, wherein the metal shell complies with the USB Type-C interface specification and has a shell body, at least one elastic piece disposed on the shell body, a positioning protrusion disposed adjacent to the elastic piece, two positioning pieces individually disposed on two sides of the shell body, and two positioning slits disposed at the rear end of the shell body.

11. The board-to-board connector according to claim 10, wherein the second circuit board is proved with two limiting slits corresponding to the two positioning slits, wherein the first circuit board is provided with two positioning portions corresponding to the two positioning pieces.

12. The board-to-board connector according to claim 10, wherein part of the at least one elastic piece and the positioning protrusion protrude toward the tongue assembly, wherein the two positioning pieces penetrate into or are evenly soldered to the individual two positioning portions.

* * * * *